(12) United States Patent
Gans

(10) Patent No.: US 12,001,715 B2
(45) Date of Patent: Jun. 4, 2024

(54) MEMORY WITH VIRTUAL PAGE SIZE

(71) Applicant: Micron Technology, Inc., Boise, ID (US)

(72) Inventor: Dean D. Gans, Nampa, ID (US)

(*) Notice: Subject to any disclaimer, the term of this patent is extended or adjusted under 35 U.S.C. 154(b) by 21 days.

(21) Appl. No.: 17/557,818

(22) Filed: Dec. 21, 2021

(65) Prior Publication Data

US 2022/0188035 A1 Jun. 16, 2022

Related U.S. Application Data

(63) Continuation of application No. 15/684,773, filed on Aug. 23, 2017, now Pat. No. 11,210,019.

(51) Int. Cl.
*G06F 3/06* (2006.01)
*G06F 12/1009* (2016.01)

(52) U.S. Cl.
CPC .......... *G06F 3/0659* (2013.01); *G06F 3/0604* (2013.01); *G06F 3/0673* (2013.01); *G06F 12/1009* (2013.01); *G06F 2212/65* (2013.01)

(58) Field of Classification Search
CPC .... G06F 3/0659; G06F 3/0604; G06F 3/0673; G06F 12/1009; G06F 2212/65
See application file for complete search history.

(56) References Cited

U.S. PATENT DOCUMENTS

| | | | |
|---|---|---|---|
| 5,424,976 A | 6/1995 | Cuppens | |
| 5,930,829 A | 7/1999 | Little | |
| 6,154,823 A | 11/2000 | Benayon et al. | |
| 6,201,727 B1 | 3/2001 | Jeon | |
| 7,400,549 B2 | 7/2008 | Han et al. | |
| 7,483,333 B2 | 1/2009 | Skidmore | |
| 7,755,968 B2 | 7/2010 | Woo et al. | |
| 8,108,648 B2 | 1/2012 | Srinivasan et al. | |

(Continued)

FOREIGN PATENT DOCUMENTS

| CN | 101681298 A | 3/2010 |
|---|---|---|
| CN | 101727976 A | 6/2010 |

(Continued)

OTHER PUBLICATIONS

Korean Patent Office, "Notice of Reasons for Rejection", issued in connection with Korean Patent Application No. 10-2020-7007817 dated Aug. 14, 2022 (9 pages).

(Continued)

*Primary Examiner* — Nanci N Wong
(74) *Attorney, Agent, or Firm* — Holland & Hart LLP

(57) ABSTRACT

Methods, systems, and devices for memory with a virtual page size are described. Memory cells may be accessed in portions or page sizes that are tailored to a particular use or application. A variable page size may be defined that represents a subset or superset of memory cells in a nominal page size for the array. For example, memory cells associated with a page size of a memory array may be accessed with commands to a memory array. Each command may contain a particular addressing scheme based on the page size of the memory array and may activate one or more sets of memory cells within the array. The addressing scheme may be modified based on the page size of the memory array. Upon activating a desired set of memory cells, one or more individual activated cells may be accessed.

20 Claims, 10 Drawing Sheets

(56) References Cited

U.S. PATENT DOCUMENTS

| | | | |
|---|---|---|---|
| 8,151,036 B2 | 4/2012 | Yasufuku | |
| 8,171,192 B2 | 5/2012 | Maddali et al. | |
| 9,025,396 B1* | 5/2015 | Koushan | G11C 13/0069 |
| | | | 365/189.16 |
| 9,224,462 B2 | 12/2015 | Kwak et al. | |
| 9,235,546 B2 | 1/2016 | Pekny et al. | |
| 9,432,298 B1 | 8/2016 | Smith | |
| 9,582,424 B2 | 2/2017 | Gschwind et al. | |
| 9,600,410 B1 | 3/2017 | Nazarian et al. | |
| 9,715,918 B1 | 7/2017 | Kawamura | |
| 9,990,163 B2 | 6/2018 | Cha et al. | |
| 10,418,085 B2 | 9/2019 | Kim et al. | |
| 10,566,040 B2 | 2/2020 | Corrado | |
| 2006/0271748 A1 | 11/2006 | Jain et al. | |
| 2008/0010416 A1 | 1/2008 | Beeston et al. | |
| 2008/0288742 A1 | 11/2008 | Hepkin et al. | |
| 2009/0157983 A1* | 6/2009 | Bowyer | G11C 8/10 |
| | | | 711/E12.001 |
| 2009/0196103 A1* | 8/2009 | Kim | G11C 16/0483 |
| | | | 365/185.23 |
| 2010/0157641 A1 | 6/2010 | Shalvi et al. | |
| 2011/0040927 A1 | 2/2011 | Fuxa et al. | |
| 2011/0087855 A1 | 4/2011 | Frost et al. | |
| 2012/0079174 A1 | 3/2012 | Nellans et al. | |
| 2012/0131180 A1 | 5/2012 | Nomura et al. | |
| 2012/0155160 A1 | 6/2012 | Alam et al. | |
| 2012/0159050 A1 | 6/2012 | Yano et al. | |
| 2012/0224441 A1 | 9/2012 | Ko et al. | |
| 2013/0111147 A1 | 5/2013 | Mogul et al. | |
| 2013/0170313 A1 | 7/2013 | Earle et al. | |
| 2013/0201770 A1 | 8/2013 | Harris et al. | |
| 2013/0234727 A1 | 9/2013 | Baker | |
| 2013/0279251 A1* | 10/2013 | Lee | G11C 16/0408 |
| | | | 365/185.12 |
| 2014/0219007 A1 | 8/2014 | Dally | |
| 2014/0281327 A1 | 9/2014 | Dong et al. | |
| 2015/0070972 A1 | 3/2015 | Kitagawa et al. | |
| 2015/0254178 A1 | 9/2015 | Van Aken | |
| 2016/0321182 A1 | 11/2016 | Grubisic et al. | |
| 2016/0342342 A1* | 11/2016 | Kan | G06F 12/0802 |
| 2017/0017434 A1 | 1/2017 | Bang et al. | |
| 2017/0263295 A1 | 9/2017 | Xiao et al. | |
| 2017/0358338 A1 | 12/2017 | Derner et al. | |
| 2018/0081580 A1 | 3/2018 | Goel et al. | |
| 2018/0188988 A1 | 7/2018 | Jain et al. | |
| 2018/0226116 A1 | 8/2018 | Derner et al. | |
| 2018/0261292 A1* | 9/2018 | Helm | G11C 16/10 |
| 2018/0307620 A1 | 10/2018 | Zhou | |
| 2018/0373313 A1 | 12/2018 | Hasbun | |
| 2019/0004796 A1 | 1/2019 | Pelster et al. | |
| 2019/0043595 A1 | 2/2019 | Vimercati et al. | |
| 2019/0065105 A1 | 2/2019 | Gans | |
| 2019/0347202 A1 | 11/2019 | Hasbun et al. | |

FOREIGN PATENT DOCUMENTS

| | | |
|---|---|---|
| CN | 103339618 A | 10/2013 |
| CN | 106463172 A | 2/2017 |
| CN | 106575259 A | 4/2017 |
| JP | 06-314494 A | 11/1994 |
| JP | 2000-353381 A | 12/2000 |
| JP | 2001-184257 A | 7/2001 |
| JP | 2004-171753 A | 6/2004 |
| JP | 2008-541334 A | 11/2008 |
| JP | 2009-134828 A | 6/2009 |
| JP | 2014-059876 A | 4/2014 |
| JP | 2014-160489 A | 9/2014 |
| JP | 2016-038920 A | 3/2016 |
| JP | 2016-095889 A | 5/2016 |
| KR | 10-2012-0100435 A | 9/2012 |
| KR | 10-2017-0010274 A | 1/2017 |
| KR | 10-2017-0045806 A | 4/2017 |
| TW | 201109924 A | 3/2011 |
| TW | 201437817 A | 10/2014 |
| WO | 2009/051953 A1 | 4/2009 |
| WO | 2016/154088 A1 | 9/2016 |

OTHER PUBLICATIONS

Details of GDDR5 Succeeding Memory "HBM" Laminated with Hiroshige Goto and TSV Technology, May [[online], 2014 Year ] 01, [Reiwa Mar. 2021, Dec. 15 Search], and Internet< URL : https://pc.watch.impress.co.jp/docs/column/kaigai/646660.html.

European Patent Office, "Extended Search Report," issued in connection with European Patent Application No. 18848403.4, dated Apr. 23, 2021 (8 pages).

Intellectual Property Office, "Office Action," issued in connection with ROC (Taiwan) Pat. Appln. No. 107129210, dated Dec. 13, 2019 (7 pages).

International Search Report and Written Opinion received for PCT Patent Application No. PCT/US18/46462, dated Nov. 28, 2018, 12 pages.

International Search Report and Written Opinion received for PCT Patent Application No. PCT/US18/47328, dated Dec. 17, 2018, 16 pages.

IPO, "Office Action," issued in connection with ROC (Taiwan) Patent Application No. 107129209, dated May 27, 2019 (13 pages).

Japan Patent Office, "Notice of Rejection Ground," issued in connection with Japanese Patent Application No. 2020-510110, dated May 11, 2021 (7 pages with translation).

Japanese Patent Office, "Notice of Rejection", Issued in connection with Japanese Patent Application No. 2020-510082, dated Feb. 9, 2021 (11 pages).

KIPO, "Notice of Reasons for Rejection," issued in connection with Korean Patent Application No. 10-2020-7007815, dated Dec. 23, 2020 (27 pages).

Korean Intellectual Property Office, "Notice of Reasons for Rejection," issued in connection with Korean Patent Application No. 10-2020-7007815, dated Dec. 28, 2021 (8 pages).

Korean Intellectual Property Office, "Notice of Reasons for Rejection," issued in connection with Korean Patent Application No. 10-2020-7007817, dated Jul. 14, 2021 (14 pages).

Notice of Reasons for Refusal received for Japanese Application No. 2020-510110, dated Dec. 20, 2021, 10 pages (5 pages of English Translation and 5 pages of Original Document).

Office Action received for Korean Patent Application No. 10-2020-7007817, dated Jan. 19, 2022, 4 pages (2 pages of English Translation and 2 pages of Original Document).

Taiwan Intellectual Property Office, "Office Action," issued in connection with ROC (Taiwan) Patent Application No. 109124223, dated Feb. 5, 2021 (5 pages).

Yanan Cao, Long Chen and Zhao Zhang, "Flexible memory: A novel main memory architecture with block-level memory compression," 2015 IEEE International Conference on Networking, Architecture and Storage (NAS), 2015, pp. 285-294.

Ashok K. Sharma, "Advanced Nonvolatile Memory Designs and Technologies," in Advanced Semiconductor Memories: Architectures, Designs, and Applications, IEEE, 2003, pp. 319-477, ch5.

H. B. Kang et al., "Multi-phase-driven split-word-line ferroelectric memory without plate line," 1999 IEEE International Solid-State Circuits Conference. Digest of Technical Papers. ISSCC. First Edition (Cat. NO.99CH36278), 1999, pp. 108-109.

T. Nishihara and Y. Ito, "A quasi-matrix ferroelectric memory for future silicon storage," in IEEE Journal of Solid-State Circuits, vol. 37, No. 11, pp. 1479-1484, Nov. 2002.

Chinese Patent Office, "Office Action and Search Report", issued in connection with Chinese Patent Application No. 201880053973.8 dated Apr. 1, 2023 (23 pages) (12 pages of English Translation and 11 pages of Original Document).

Chinese Patent Office, "Office Action and Search Report", issued in connection with Chinese Patent Application No. 201880059390.6 dated Mar. 29, 2023 (10 pages) (3 pages of English Translation and 7 pages of Original Document).

Yeonbae Chung, Jung-Hyun Kim and Jae-Eun Yoon, "Ferroelectric memory design based on grounded-plate PMOS-gate cell architec-

(56) References Cited

OTHER PUBLICATIONS ture," 2003 IEEE Conference on Electron Devices and Solid-State Circuits (IEEE Cat. No.03TH8668), Hong Kong, China, 2003, pp. 55-58.

Japan Patent Office, "Decision to Grant," issued in connection with Japan Patent Application No. 2022-182204 dated Nov. 16, 2023 (5 pages) (2 pages of English Translation and 3 pages of Original Document).

* cited by examiner

MEMORY WITH VIRTUAL PAGE SIZE

CROSS REFERENCE

The present Application for Patent is a continuation of U.S. patent application Ser. No. 15/684,773 by Gans, entitled "MEMORY WITH VIRTUAL PAGE SIZE," filed Aug. 23, 2017, assigned to the assignee hereof, and is expressly incorporated by reference in its entirety herein.

BACKGROUND

The following relates generally to operating a memory array and more specifically to memory with a virtual page size.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Static memory page sizes may limit the flexibility or possible operating characteristics that would allow such metrics to be improved.

DETAILED DESCRIPTION

Figure 1:
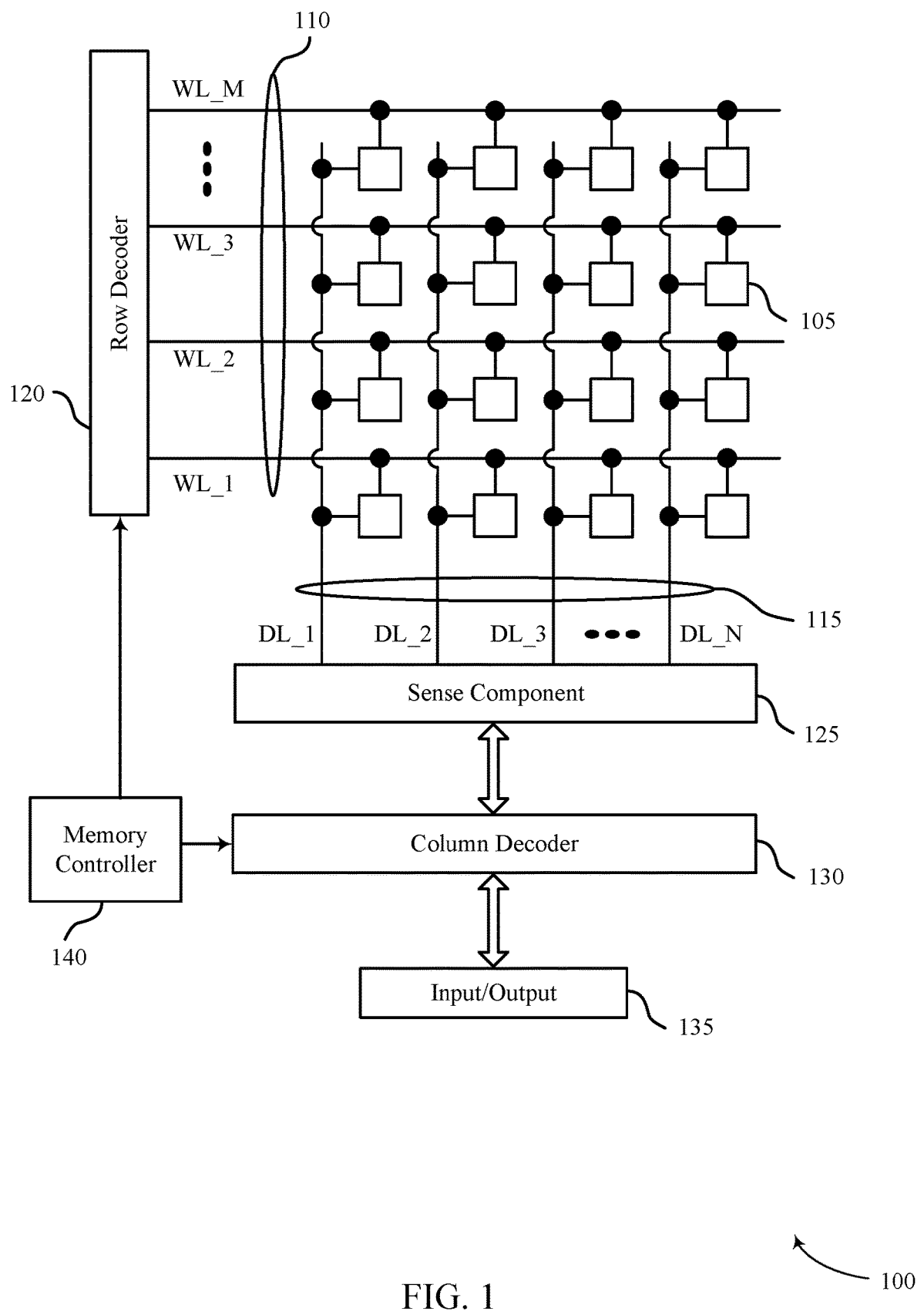
FIG. 1 illustrates an exemplary memory device that supports features and operations with a virtual page size in accordance with examples of the present disclosure.

A variable page size may be defined that represents a subset or superset of memory cells in a nominal page size for the array. Memory cells may thus be accessed in portions or page sizes that are tailored to a particular use or application. Variable page sizes may allow for more efficient use of resources, including power, time, processing capacity, and the like, because unnecessary activation of or access to cells may be avoided.

By way of example, the memory array may be composed of multiple memory banks, with each bank containing several memory sections. Each memory section may have an array of memory cells and a set of sense components (e.g., sense amplifiers) to read or program the memory cells. To access one or more memory cells, a page size associated with a memory array may first be determined. One or more sets of memory cells associated with the page may be activated. Because the page size may vary, the number of sets of active memory cells may vary.

The addressing scheme used to access one or more memory cells may be determined based on the page size. A memory controller may, for example, first determine a page size associated with a first set of memory cells of a memory array and subsequently use the page size to activate a second set of memory cells. The determined page size associated with the first set of memory cells may, for example, correspond to at least one of the rows of memory cells and at least one of the columns of memory cells. Once the second set of cells has been activated, the memory controller may access one or more active cells. Thus, the accessed cells may be accessed based at least in part on the page size of the memory array. Alternatively, for example, the memory controller may first identify a first set of memory cells corresponding to a first page size and subsequently activate a subset of the first page size. Once the subset of cells has been activated, the memory controller may access one or more active memory cells.

Virtual page size operations described herein may offer a number of benefits. For example, one or more memory cells may be accessed in a time period similar to a fixed-page access operation. Memory cells located within a multitude of page sizes may be dynamically accessed in a similar time period as memory cells within a fixed operation. Thus, if an increase in page size for a particular operation is desired, the time needed to access one or more memory cells may not be sacrificed.

In some examples, the page size may be determined upon powering on a device that contains the memory array. In other examples, the page size may be changed by receiving a command. For example, a software application may determine a preferred page size based on various factors and then instruct the memory array to use such a page size.

Features of the disclosure introduced above are further described below in the context of a memory array. Specific examples are then described for a memory array that supports a virtual page size as well as its operation. These and other features of the disclosure are further illustrated by and described with reference to apparatus diagrams, system diagrams, and flowcharts that relate to a virtual page size architecture. The disclosure may relate to any non-volatile memory. Although some examples are discussed with reference to a ferroelectric capacitor, the present disclosure is not limited to ferroelectric memories. For example, the disclosure may relate to cross-point memories, resistive memories, chalcogenide-based memories, magnetic memories, flash memories, thin film memories, among other memory types.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

Memory array 100 may represent a memory array, memory bank, or a particular set of memory cells (e.g., a memory page). A memory array may be split into memory pages to improve timing of access operations within a single memory component, such as a chip. A memory page may be multiple rows and columns across multiple memory components (e.g., chips). A memory bank, memory section, or memory page may be part of a 2D or of a 3D memory array (e.g., memory array 100 may be 2D or 3D). A single read or write operation may be performed at one time within a particular memory page.

Each memory array may be divided into memory pages in which each page has its own set of sense components 125. For example, a memory bank may be divided into 32 separate memory pages. By dividing a bank into pages, the total length of each bit line 115 within the memory page is reduced compared to a non-sectioned bank. These shorter bit lines 115 may improve the operation speed of the memory array.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

One or more memory cells 105 located within a memory page may be accessed in multiple ways. For example, a page size associated with a first set of memory cells of memory array 100 may first be determined. The determined page size associated with the first set of memory cells may correspond to at least one of the rows of memory cells and at least one of the columns of memory cells. Upon determining the page size, an indication of the page size may be sent to memory array 100 to activate a second set of memory cells. One or more memory cells (e.g., memory cell 105) may then be accessed. Alternatively, for example, a first command may be sent to memory array 100 to identify a first set of memory cells. A first quantity of memory cells—e.g., at least one physical row of memory cells and at least one physical column of memory cells—in the set may correspond to a nominal page size of memory array 100. Subsequently, a second command may be sent to memory array 100 to activate a subset of the set of memory cells (e.g., a second set of memory cells). A second quantity of memory cells, located within the subset, may correspond to an internal page size of memory array 100. The subset of memory cells may be accessed by sending an access command, which may include an addressing scheme based at least in part on the second command. In some examples, a third command may be sent to memory array 100 to activate a subset of the subset of the set of memory cells (e.g., a third set of memory cells). A third quantity of memory cells, located within the subset of the subset of the set, may be less than the second quantity of memory cells. One or more memory cells (e.g., memory cell 105) may then be accessed.

Accessing memory cells 105 may be controlled through a row decoder 120 and a column decoder 130 that may be in communication with a plurality of row access lines and a plurality of column access lines, respectively. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL N, where M and N depend on the array size. Thus, by activating a word line 110 and a digit line 115, e.g., WL_2 and DL_3, the memory cell 105 at their intersection may be accessed.

Some or all of the memory cells 105 within the row may then be sensed by sense component 125 to determine the stored state of the memory cell 105. The detected logic state may be latched, or stored in a buffer, which may be part of column decoder 130. This process may be referred to as opening a memory page. The data of the memory page may then be repeatedly accessed (e.g., sent to the processor) without having to activate the word line 110 and sense component 125 each time. This may improve the access time of the memory array 100. Data contained in the memory page may then be output through column decoder 130 as output 135. For example, a column address may be sent to column decoder 130 to select one or a subset of logic values to output to a bus. This column address may be a string of binary bits to select the subset logic values. As the page size may dynamically change, the number of bits in the column address may also change. For example, if the page size doubles, twice as many subsets are now available, and the number of bits in the column address may be increased.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some examples, the memory page size is configurable. Memory array 100 may represent a first set of memory cells of a memory array. This may be referred to as a first page size. The size of the page may correspond to a predetermined row address or column address of one or more specific memory cells. For example, a first page size of 16 Gb may correspond to a first subset of row addresses or column addresses, whereas a first page size of 32 Gb may correspond to a second subset of row addresses or column addresses. The first subset and second subset of row addresses or column addresses may contain none, some, or all of the same rows or columns of memory cells. The page size of the first page may be determined and sent to memory array 100 to activate a second set of memory cells—a second page size. Subsequently, at least one memory cell of the second page may then be accessed. Additionally or alternatively, for example, the first page may be referred to as a nominal page, and the quantity of cells (or bits representative of the cells) may be referred to as a nominal page size. A subset of memory cells that make up the nominal page may be identified or activated. This subset of memory cells may be referred to as an internal page or virtual page, and the quantity of cells (or bits representative of the cells) may be referred to as the internal page size or virtual page size. One or more memory cells of the internal page may then be accessed.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed herein, nonvolatile cells, including ferroelectric memory cells 105, may have beneficial properties that may result in improved performance relative to other memory architectures. This may include supporting or allowing virtual page size techniques described herein.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
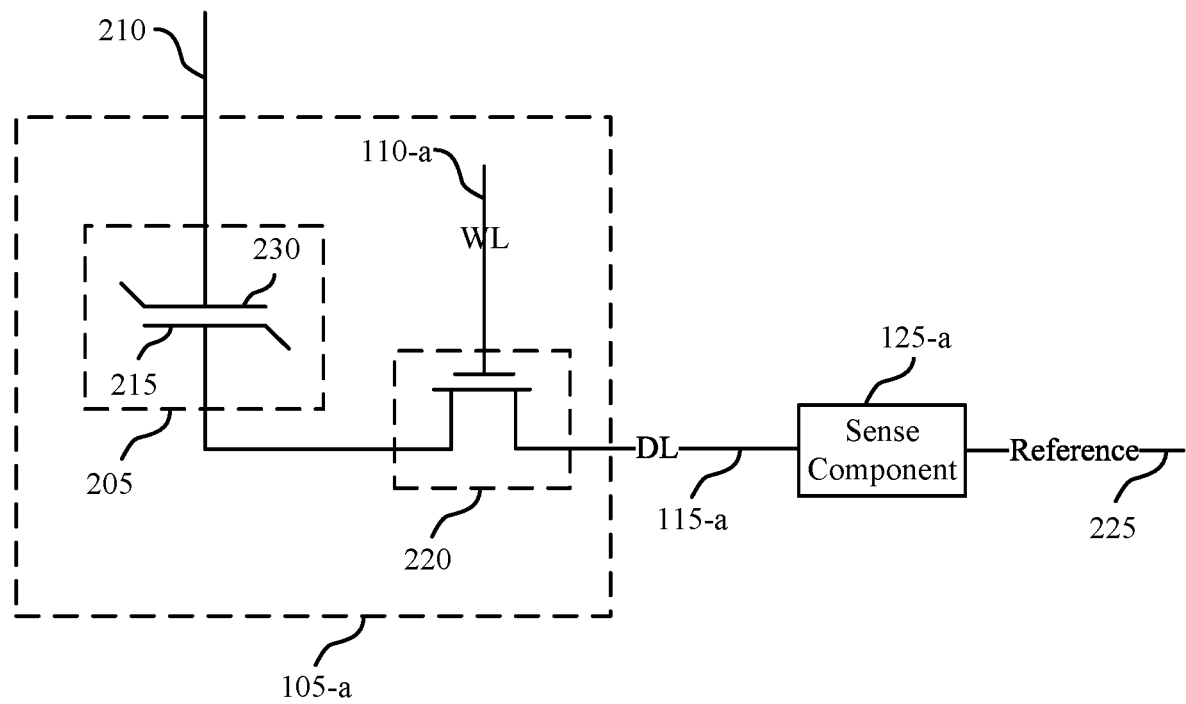
FIG. 2 illustrates an exemplary memory device that supports features and operations with a virtual page size in accordance with examples of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. The circuit 200 may support virtual page size techniques; for example, a memory array having components similar to those described with reference to FIG. 1 may support virtual page size operations.

Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
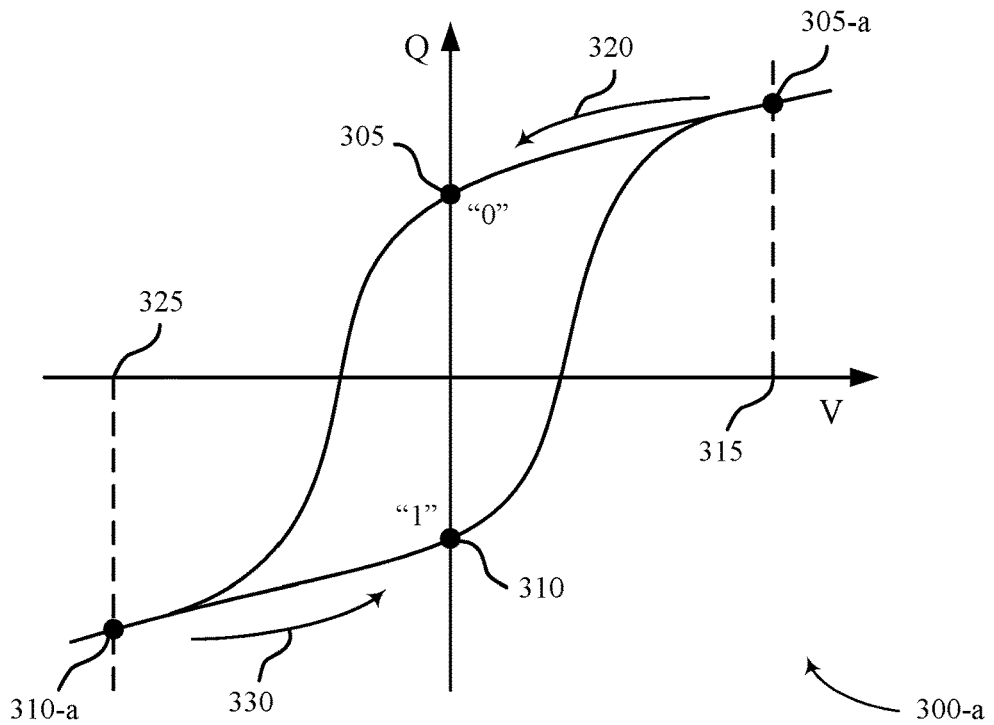
FIG. 3 illustrates an example of non-linear electrical properties with hysteresis curves for a memory device that is operated in accordance with examples of the present disclosure.
Figure 3:
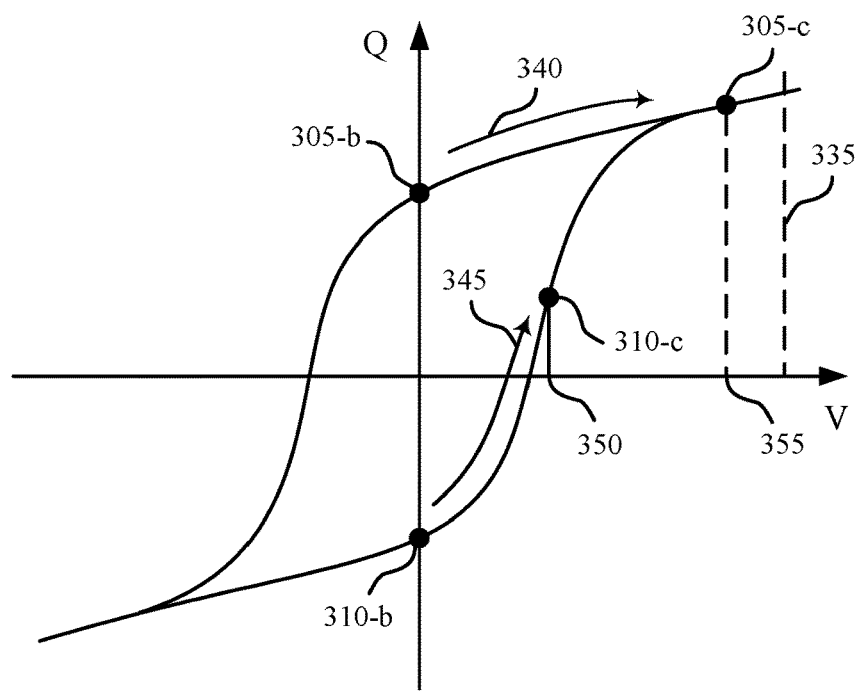

FIG. 3 illustrates an example of non-linear electrical properties with hysteresis curves 300-a and 300-b for a ferroelectric memory cell that is operated in accordance with various embodiments of the present disclosure. The non-linear properties of the ferroelectric memory cell may support the virtual page size techniques described herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-a and 300-b represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

For example, as depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be read from the memory cell by applying a voltage across the capacitor of the accessed memory cell. To access the memory cell, a page size associated with a first set of memory cells of a memory array (e.g., memory array 100 with reference to FIG. 1) may be determined. Upon determining the page size associated with the first set of memory cells, an indication of the page size may be sent to the memory array. This indication may include a predetermined row address or column address, corresponding to specific memory cells based on the size of the page. For example, different page sizes may correspond to different rows or columns of memory cells. Sending the indication of the page size may activate a second set of memory cells. Once the second set of memory cells is activated, at least one memory cell within the second set may be accessed.

Upon accessing at least one memory cell, a voltage may be applied across the capacitor of the accessed memory cell. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

Alternatively, for example, a logic 0 or 1 may be written to an accessed memory cell by controlling the electric polarization of the ferroelectric material, and thus the charge on the capacitor terminals, by applying a voltage. To write a logic 0 or a logic 1 to the memory cell, for example, the memory cell may first be accessed. Similar to accessing a memory cell in a read operation, a page size associated with a first set of memory cells of a memory array (e.g., memory array 100 with reference to FIG. 1) may first be determined. Upon determining the page size associated with the first set of memory cells, an indication of the page size may be sent to the memory array. As discussed above, this indication may include a predetermined row address or column address, corresponding to specific memory cells based on the size of the page. For example, different page sizes may correspond to different rows or columns of memory cells. Sending the indication of the page size may activate a second set of memory cells. Once the second set of memory cells are activated, at least one memory cell within the second set may be accessed.

A write operation may then be carried out by applying a net positive voltage 315 across the capacitor, resulting in a charge accumulation until charge state 305-a is reached. Upon removing voltage 315, charge state 305-a may follow path 320 until it reaches charge state 305 at zero voltage. Similarly, charge state 310 may be written to the at least one accessed memory cell by applying a net negative voltage 325, which results in charge state 310-*a*. After removing negative voltage 325, charge state 310-*a* may follow path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

Alternatively, for example, a logic 0 or 1 may be read from a memory cell that is accessed by first sending a first command to identify a set of memory cells of a memory array (e.g., memory array 100 with reference to FIG. 1). The first command may be configured to identify at least one physical row of memory cells and at least one physical column of memory cells. A first quantity of memory cells of the set may correspond to a nominal page size of the array. Stated alternatively, for example, the at least one physical row and the at least one physical column may correspond to the nominal page size of the memory array. Subsequently, for example, a second command may be sent to activate a subset of the set of memory cells. A second quantity of memory cells in the subset may correspond to an internal page size of memory array. Once the internal page is activated, at least one active memory cell may be accessed.

Upon accessing at least one memory cell, a voltage may be applied across the capacitor of the accessed memory cell. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

Alternatively, for example, a logic 0 or 1 may be written to an accessed memory cell by controlling the electric polarization of the ferroelectric material, and thus the charge on the capacitor terminals, by applying a voltage. To write a logic 0 or a logic 1 to the memory cell, for example, the memory cell may first be accessed. Similar to accessing a memory cell in a read operation, a first command to identify a set of memory cells of a memory array (e.g., memory array 100 with reference to FIG. 1) may be sent. A first quantity of memory cells of the set may correspond to a nominal page size of the array. Subsequently, for example, a second command may be sent to activate a subset of the set of memory cells. A second quantity of memory cells in the subset may correspond to an internal page size of memory array. Once the internal page is activated, at least one active memory cell may be accessed.

A write operation may then be carried out, for example, by applying a net positive voltage 315 across the capacitor, resulting in a charge accumulation until charge state 305-*a* is reached. Upon removing voltage 315, charge state 305-*a* may follow path 320 until it reaches charge state 305 at zero voltage. Similarly, charge state 310 may be written to the at least one accessed memory cell by applying a net negative voltage 325, which results in charge state 310-*a*. After removing negative voltage 325, charge state 310-*a* may follow path 330 until it reaches charge state 310 at zero voltage.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction.

Figure 4:
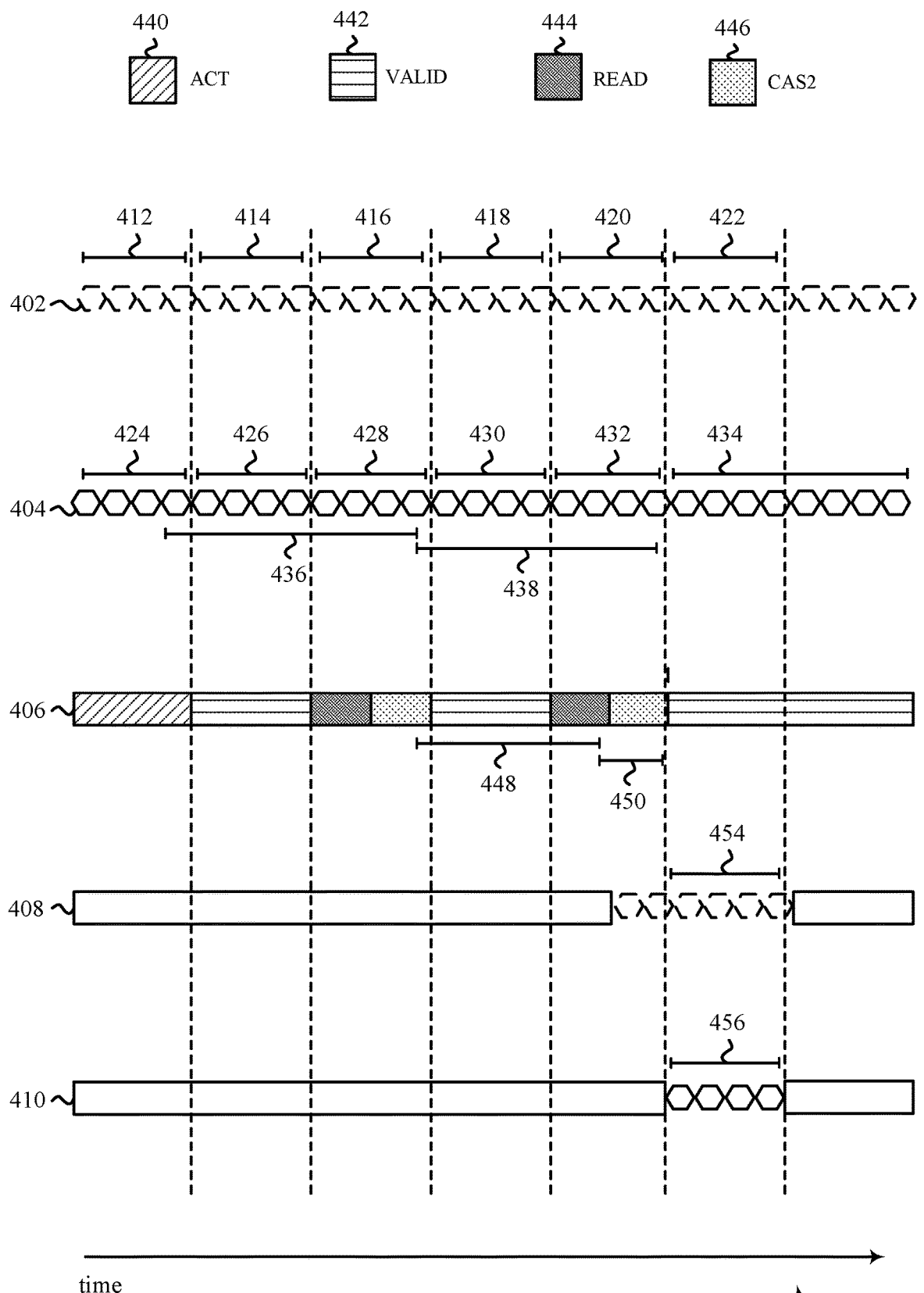
FIG. 4 illustrates a timing diagram for operating a memory device that supports features and operations with a virtual page size in accordance with examples of the present disclosure.

FIG. 4 illustrates an example timing diagram 400 for operating a memory device that supports a virtual page size in accordance with embodiments of the present disclosure. Timing diagram 400 may include system clock 402, address 404, command 406, data strobe 408, and data mask 410. Timing diagram 400 may result from operating circuit 200 with reference to FIG. 2, and the following discussion is in the context of components depicted in FIG. 1 through FIG. 3.

As discussed above, one or more memory cells may be accessed by first determining a page size associated with a first set of memory cells of a memory array. The page size, for example, may be determined in response to receiving a command to use a specific page size. An indication of the page size may be sent to the memory array to activate a second set of memory cells. At least one memory cell of the second set may then be accessed following the sending of the indication of the page size. The aforementioned steps may align with the timing of system clock 402.

System clock 402 may include clock interval 412, clock interval 414, clock interval 416, clock interval 418, clock interval 420, and clock interval 422. During clock interval 412, for example, command 440 may be transmitted to a memory array (e.g., memory array 100 with reference to FIG. 1). Command 440, which may be referred to as "ACT," may be an indication of a specific page size. The page size, for example, may be determined in response to receiving a specific command (not pictured) and may activate a second set of memory cells. The second set of memory cells may be indicated by address 424. Address 424, for example, may include multiple column addresses which may correspond to a specific page size (e.g., 512 bytes).

During clock interval 414, command 442 may be transmitted to a memory array. Command 442, for example, may be any valid command, and may be referred to as "VALID." Command 442 may be indicated by address 426, which may include multiple column addresses corresponding to a specific page size.

During clock interval 416, command 444 and command 446 may be transmitted to a memory array. Command 444 may be a read command, which may facilitate reading at least one memory cell activated by command 440. Additionally, command 446 may be a delay (e.g., a latency), in clock cycles, between sending command 444 and the time in which at least one memory cell may be read. Command 444 may be referred to as "READ" and command 446 may be referred to as "CAS2." Both commands may be indicated by address 428.

During clock interval 418, similar to clock interval 414, command 442 be transmitted to a memory array. Command 442, as previously discussed, may be any valid command (e.g., "VALID"). Command 442 may be indicated by address 430, which may include multiple column addresses corresponding to a specific page size.

During clock interval 420, command 444 and command 446 may again be transmitted to a memory array. Command 444 may again be a read command (e.g., "READ") and command 446 may again be a delay (e.g., "CAS2"). These commands may facilitate reading at least one memory cell activated by command 440 and may be a delay in clock cycles, respectively. Both commands may be indicated by address 432.

Subsequent to command 446, data may be transferred from the at least one accessed memory cell. Data may be transferred following the sending an indication of page size (e.g., command 440). The data transfer may be represented by data strobe 454 during clock interval 422. Additionally, for example, this transfer may occur concurrent with command 442 which, as previously discussed, may be any valid command (e.g., "VALID"). Data strobe 445 may be masked, as indicated by data mask 456.

Row address to column address delay 436 may occur during at least a portion of address 424, address 426, and address 428. Row address to column address delay 436 may be the number of clock intervals taken between issuing an "ACT" command (e.g., command 440) and a read or write command (e.g., command 444) with regard to a row address. Similarly, column address to column address delay 438 occurs during at least a portion of address 428, address 430, and address 432. Column address to column address delay 438 may be the number of clock intervals between issuing an "ACT" command (e.g., command 440) and a read or write command (e.g., command 444) with regard to a column address. Column address to column address delay 438 may trigger read latency 448, which may represent a delay between the time a column address is presented to the memory array and when corresponding data is made available. Data output time 450 may represent the time in which the data corresponding to a column address is available.

Figure 5:
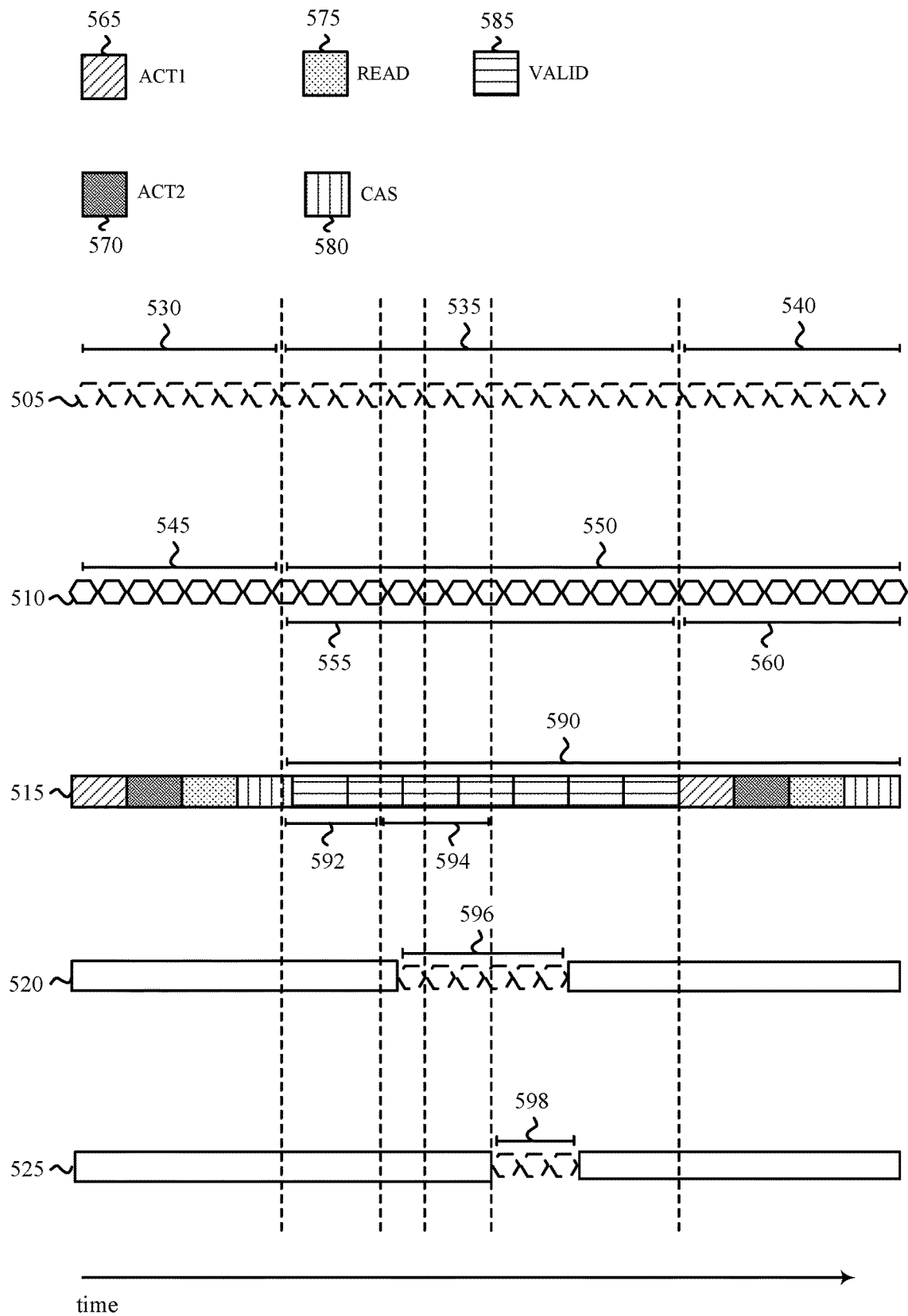
FIG. 5 illustrates a timing diagram for operating a memory device that supports features and operations with a virtual page size in accordance with examples of the present disclosure.

FIG. 5 illustrates an example timing diagram 500 for operating a memory device that supports a virtual page size in accordance with embodiments of the present disclosure. Timing diagram 500 may include system clock 505, address 510, command 515, data strobe 520, and data mask 525. Timing diagram 500 may result from operating circuit 200 with reference to FIG. 2, and the following discussion is in the context of components depicted in FIG. 1 through FIG. 3.

As discussed above, a specific memory cell may be accessed by first sending a first command to identify a set of memory cells of a memory array. A first quantity of memory cells in the set may correspond to a nominal page size of the memory array. Subsequently, for example, a second command may be sent to activate a subset of the set of memory cells. A second quantity of memory cells in the subset may correspond to an internal page size of the memory array. At least one memory cell of the subset may then be accessed. The aforementioned steps may align with the timing of system clock 505.

System clock 505 may include clock interval 530, clock interval 535, and clock interval 540. During clock interval 530, for example, command 565, command 570, command 575, and command 580 may be transmitted to a memory array. Command 565 may be a first command to identify a set of memory cells of a memory array and may be referred to as "ACT1." Command 565 may be an indication of a nominal page size of a memory array. Subsequently, for example, command 570 may be a second command sent to activate a subset of the set of memory cells. Command 570 may be referred to as "ACT2" and may be an indication of an internal page size of a memory array. The nominal page size and internal page size, for example, may be determined in response to receiving a specific command (not pictured) and may be indicated by all or a portion of address 545. Address 545, for example, may include multiple column addresses which may correspond to a specific page size (e.g., 512 bytes).

Command 575 and command 585 may also be included in clock interval 530. Command 575 may be a read command, which may facilitate reading at least one memory cell activated by command 570. Command 575 may be referred to as "READ." Additionally, command 580 may be a delay (e.g., a latency), in clock cycles, between sending command 575 and the time in which at least one memory cell may be read. Command 580 may be referred to as "CAS."

During clock interval 535, command 585 may be transmitted to a memory array. Command 585 may be any valid command and may be referred to as "VALID." Command 585 may be indicated by address 555, which may include multiple column addresses corresponding to a specific page size. Concurrent with at least a portion of command 585, data may be transferred from the at least one accessed memory cell. Data may be transferred, for example, as a result of command 570. The data transfer may be represented by data strobe 596 during at least a portion of clock interval 535. Additionally, for example, at least a portion of data strobe 596 may be masked, as indicated by data mask 598.

Clock interval 540, like clock interval 530, may include command 565, command 570, command 575, and command 580. Command 565 may be a first command to identify a set of memory cells of a memory array. Subsequently, for example, command 570 may be a second command sent to activate a subset of the set of memory cells. Upon sending command 570, command 575 may be a read operation intended to facilitate reading at least one memory cell activated by command 565 and command 570. Additionally, command 580 may be a delay (e.g., a latency), in clock cycles, between sending command 575 and the time in which at least one memory cell may be read. These commands may be repeated to further read data from one or more accessed memory cells of a memory array.

Column to column address delay 550 occurs during at least a portion of clock interval 535 and clock interval 540. Column to column address delay 550 may be the number of clock cycles taken between issuing an active command (e.g., command 440) and a read or write command (e.g., command 444) with regard to a column address. Similarly, row to row address delay 590 occurs during at least a portion of clock interval 535 and clock interval 540. Row to row address delay 590 may be the number of clock cycles taken between issuing an active command (e.g., command 440) and a read or write command (e.g., command 444) with regard to a row address. Column to column address delay 550 may trigger read latency 592, which may represent a delay between the time a column address is presented to the memory array and when corresponding data is made available. Data output 594 may represent the time in which the data corresponding to a column address is available.

Figure 6:
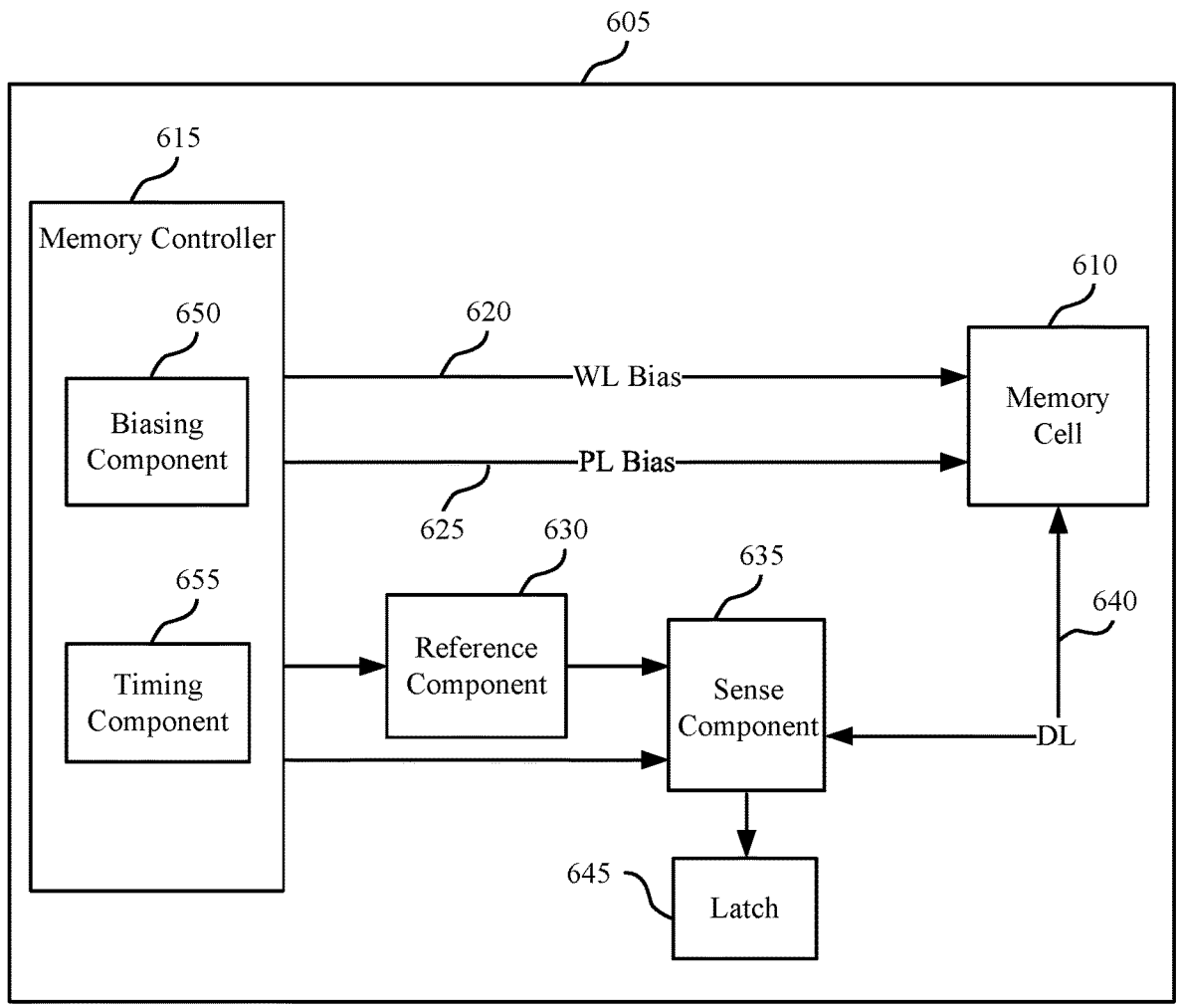
FIG. 6 illustrates an exemplary memory device that supports features and operations with a virtual page size in accordance with examples of the present disclosure.

FIG. 6 shows a block diagram 600 of a memory array 605 that supports virtual page size techniques in accordance with embodiments of the present disclosure. Memory array 605 may be referred to as an electronic memory apparatus, and may be an example of a component of a memory array 100 as described with reference to FIG. 1. Memory array 605 may be supported by a circuit (e.g., circuit 200) that may support virtual page size techniques; for example, a memory array having components similar to those described with reference to FIG. 1 may support virtual page size operations.

Memory array 605 may include one or more memory cells 610, a memory controller 615, a word line 620, a plate line 625, a reference component 630, a sense component 635, a digit line 640, and a latch 645. Memory cell 510 may represent, for example, a first set of memory cells, a second set of memory cells, or a third set of memory cells as described with reference to FIG. 1. These components may be in electronic communication with each other and may perform one or more of the functions described herein. In some cases, memory controller 615 may include biasing component 650 and timing component 655.

Memory controller 615 may be in electronic communication with word line 620, digit line 640, sense component 635, and plate line 625, which may be examples of word line 110, digit line 115, sense component 125, and plate line 210 described with reference to FIG. 1 and FIG. 2. Memory array 605 may also include reference component 630 and latch 645. The components of memory array 605 may be in electronic communication with each other and may perform some or all of the functions described with reference to FIG. 1 through FIG. 4. In some cases, reference component 630, sense component 635, and latch 645 may be components of memory controller 615.

In some examples, digit line 640 may be in electronic communication with sense component 635 and a ferroelectric capacitor of ferroelectric memory cells 610. A ferroelectric memory cell 610 may be writable with a logic state (e.g., a first or second logic state). Word line 620 may be in electronic communication with memory controller 615 and a selection component of ferroelectric memory cell 610. Plate line 625 may be in electronic communication with memory controller 615 and a plate of the ferroelectric capacitor of ferroelectric memory cell 610. Sense component 635 may be in electronic communication with memory controller 615, digit line 640, latch 645, and reference line 660. Reference component 630 may be in electronic communication with memory controller 615 and reference line 660. Sense control line 665 may be in electronic communication with sense component 635 and memory controller 615. These components may also be in electronic communication with other components, both inside and outside of memory array 605, in addition to components not listed above, via other components, connections, or busses.

Memory controller 615 may be configured to activate word line 620, plate line 625, or digit line 640 by applying voltages to those various nodes. For example, biasing component 650 may be configured to apply a voltage to operate memory cell 610 to read or write memory cell 610 as described above. In some cases, memory controller 615 may include a row decoder, column decoder, or both, as described with reference to FIG. 1. This may enable memory controller 615 to access one or more memory cells 105. Biasing component 650 may also provide voltage to reference component 630 in order to generate a reference signal for sense component 635. Additionally, biasing component 650 may provide voltage for the operation of sense component 635.

In some cases, memory controller 615 may perform its operations using timing component 655. For example, timing component 655 may control the timing of the various word line selections or plate biasing, including timing for switching and voltage application to perform the memory functions, such as reading and writing, discussed herein. In some cases, timing component 655 may control the operations of biasing component 650.

Reference component 630 may include various components to generate a reference signal for sense component 635. Reference component 630 may include circuitry configured to produce a reference signal. In some cases, reference component 630 may be implemented using other ferroelectric memory cells 105. Sense component 635 may compare a signal from memory cell 610 (through digit line 640) with a reference signal from reference component 630. Upon determining the logic state, the sense component may then store the output in latch 645, where it may be used in accordance with the operations of an electronic device that memory array 605 is a part. Sense component 635 may include a sense amplifier in electronic communication with the latch and the ferroelectric memory cell.

Memory controller 615 may be configured to determine a page size associated with a first set of memory cells of a memory array. For example, memory controller may receive an indication of a page size from another device or component. The memory controller may send an indication of the page size to activate a second set of memory cells. For example, biasing component 650 may provide voltage to word, bit, or plate lines to activate or access the second set of memory cells. Memory controller 615 may, in combination with sense component 635, read one or more memory cells of the second set of memory cells associated with the page size following the sending an indication of the page size. The second set of cells may be an integer multiple of the page size.

Additionally or alternatively, memory controller 615 may send a first command to identify a set of memory cells of a memory array and send a second command that activates a subset of the set of memory cells. This may include sending commands to row and column decoders (not shown). Or may include providing voltage to word, bit, or plate lines, via biasing component 650, to activate various memory cells. Memory controller 615 may, in combination with sense component 635, access at least one memory cell of the subset.

Memory controller 615 or at least some of its various sub-components may be implemented in hardware, software executed by a processor, firmware, or any combination thereof. If implemented in software executed by a processor, the functions of the memory controller 615 or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 615 or at least some of its various sub-components may be physically located at various positions, including being distributed such that portions of functions are implemented at different physical locations by one or more physical devices. In some examples, memory controller 615 or at least some of its various sub-components may be a separate and distinct component in accordance with various embodiments of the present disclosure. In other examples, memory controller 615 or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Figure 7:
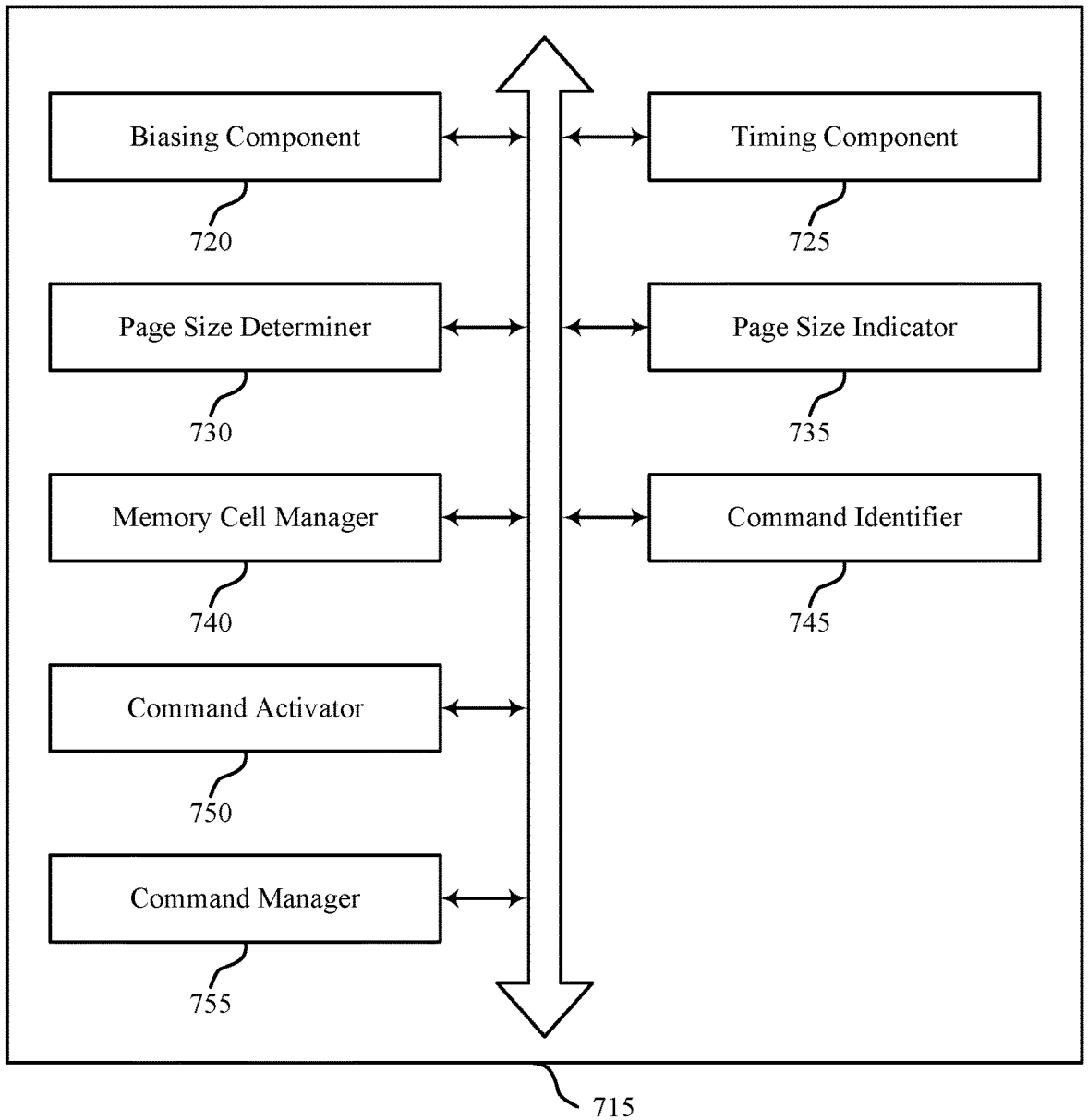
FIG. 7 illustrates an exemplary memory device that supports features and operations with a virtual page size in accordance with examples of the present disclosure.

FIG. 7 shows a block diagram 700 of a memory controller 715 that supports virtual page size techniques in accordance with embodiments of the present disclosure. The memory controller 715 may be an example of a memory controller 615 described with reference to FIG. 6. The memory controller 715 may include biasing component 720, timing component 725, page size determiner 730, page size indicator 735, memory cell manager 740, command identifier 745, command activator 750, and command manager 755. Each of these modules may communicate, directly or indirectly, with one another (e.g., via one or more buses).

Memory controller 715 may be operable to determine a page size associated with a first set of memory cells of a memory array (e.g., memory array 100 with reference to FIG. 1). Memory controller 715 may send an indication of the page size to the memory array to activate a second set of memory cells. Additionally, for example, memory controller 715 may access at least one memory cell of the second set of memory cells following the sending the indication of the page size. Additionally or alternatively, memory controller 715 may be operable to send a first command to identify a set of memory cells, wherein a first quantity of memory cells in the set may correspond to a nominal page size of the memory array. Memory controller 715 may then send a second command to activate a subset of the set of memory cells, and a second quantity of memory cells in the subset may correspond to an internal page size of mem memory array. Memory controller 715 may access at least one memory cell of the subset of the set of memory cells.

In some cases, a memory controller 715 may be in electronic communication with a set of row access lines and a set of column access lines, where the memory controller 715 may be operable to determine a page size associated with a first set of memory cells of a memory array. In some cases, memory controller 715 may be configured to activate at least one switch of a plurality of switches to access each of the row access lines and the column access lines with a sense component of a plurality of sense components. In some cases, the memory controller 715 may be operable to access at least one of the row of memory cells based on the sending the indication of the page size. Additionally, for example, memory controller 715 may be electronic communication with the set of row access lines and the set of column access lines and be operable to send a first command to identify a set of memory cells of a memory array.

Figure 8:
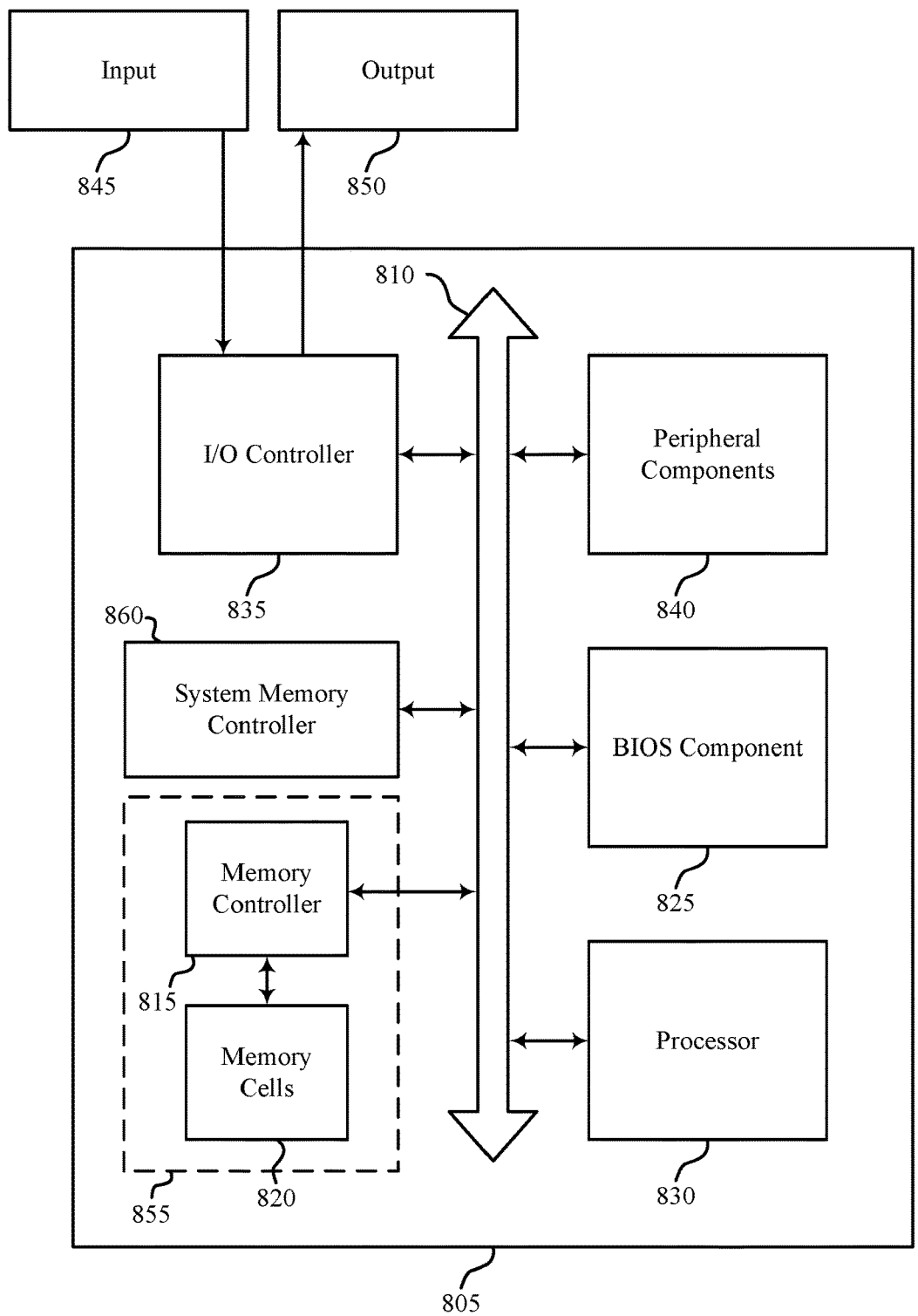
FIG. 8 illustrates an exemplary memory device that supports features and operations with a virtual page size in accordance with examples of the present disclosure.

Memory controller 715 may be in electronic communication with a host (e.g., a processor or system controller, such as system memory controller 860 illustrated in FIG. 8). For example, memory controller 715 may be operable to receive a command to use a page size, wherein the page size associated with the first set of memory cells may be determined in response to receiving the command. A host may provide the command to memory controller 715. Memory controller 715 may receive the command to use the page size from a host in electronic communication with the memory controller 715.

Memory controller 715 may further include page size determiner 730. Page size determiner 730 may determine a page size associated with a first set of memory cells of a memory array. In some cases, memory controller 715 may be in electronic communication with a set of row access lines and a set of column access lines, where the memory controller 715 may be operable to determine a page size associated with a first set of memory cells of a memory array via page size determiner 730.

Additionally, for example, memory controller 715 may include page size indicator 735. Page size indicator 735 may send an indication of the page size to the memory array to activate a second set of memory cells. Page size indicator 735 may also send an indication of the page size to activate a second set of memory cells.

Memory controller 715 may further include memory cell manager 740. Memory cell manager 740 may be operable to access at least one memory cell of the second set of memory cells following the sending the indication of the page size. Additionally, for example, memory cell manager 740 may program the at least one memory cell of the second set of memory cells based on the page size and may also read each memory cell of the second set of memory cells associated with the page size following the sending an indication of the page size. Additionally or alternatively, memory cell manager 740 may read each memory cell of the second set of memory cells based on the activation and may access at least one memory cell of the subset of the set of memory cells. Further, for example, memory cell manager 740 may program at least one memory cell of the subset based on the internal page size of the memory array and may also access at least one memory cell of the subset of the set of memory cells.

Further, for example, memory controller 715 may include command identifier 745. Command identifier 745 may send a first command to identify a set of memory cells of a memory array. A first quantity of memory cells in the set of memory cells may correspond to a nominal page size of the memory array. In some cases, for example, memory controller 715 may be in electronic communication with a set of row access lines and a set of column access lines, where the memory controller may be operable to send a first command to identify a set of memory cells of a memory array via the command identifier 745.

Memory controller 715 may also include command activator 750. Command activator 750 may send a second command to activate a subset of the set of memory cells. A second quantity of memory cells in the subset may correspond to an internal page size of the memory array. Command activator 750 may also send a third command that activates a second subset of the subset of the set of memory cells, where the second subset may a third quantity of memory cells that is less than the second quantity of memory cells.

Similarly, for example, memory controller 715 may include command manager 755. Command manager 755 may receive a command to use a page size that may be associated with the first set of memory cells. Command manager 755 may receive the command to use the page size from a host that is in electronic communication (e.g., coupled) with the memory array and may also receive an indication of the nominal page size. Command manager 755 may receive a first command that is sent in response to receiving an indication of the page size of the memory array. Command manager 755 may further receive a request to access a specific memory cell of the subset, where the second command may be sent in response to receiving the request.

Additionally or alternatively, examples of the method and apparatus described herein may include means for determining a page size associated with a first set of memory cells of a memory array, means for sending an indication of the page size to the memory array to activate a second set of memory cells, and means for accessing at least one memory cell of the second set of memory cells following the sending the indication of the page size. In some examples of the method and apparatus as described herein, the first set of memory cells may be a subset of the second set of memory cells.

Additional examples of the method and apparatus described herein may further include processes, features, means, or instructions for programming the at least one memory cell of the second set of memory cells based at least in part on the page size and processes, features, means, or instructions for receiving a command to use the page size, wherein the page size associated with the first set of memory cells may be determined in response to receiving the command. Additionally, examples of the method and apparatus described herein may further include processes, features, means, or instructions for receiving the command to use the page size from a host that may be coupled with the memory array.

Further, an apparatus for operating a memory array is described herein. The apparatus may include means for sending a first command to identify a set of memory cells of a memory array, wherein a first quantity of memory cells in the set of memory cells corresponds to a nominal page size of the memory array, means for sending a second command to activate a subset of the set of memory cells, wherein a second quantity of memory cells in the subset corresponds to an internal page size of the memory array, and means for accessing at least one memory cell of the subset of the set of memory cells. Additional examples of the method and apparatus described may further include processes, features, means, or instructions for programming at least one memory cell of the subset based at least in part on the internal page size of the memory array.

Additionally, examples of the method and apparatus described herein may include processes, features, means, or instructions for sending a third command that activates a second subset of the subset of the set of memory cells, wherein the second subset contains a third quantity of memory cells that may be less than the second quantity of memory cells. Further examples of the method and apparatus described herein may include processes, features, means, or instructions for receiving an indication of the nominal page size, wherein the first command may be sent in response to receiving the indication. Some examples of the method and apparatus described herein may further include processes, features, means, or instructions for receiving a request to access a specific memory cell or the subset, wherein the second command may be sent in response to receiving the request.

FIG. 8 shows a diagram of a system 800 including a device 805 that supports memory with a virtual page size in accordance with embodiments of the present disclosure. Device 805 may be an example of or include the components of memory array 100 as described above with reference to FIG. 1. Device 805 may include components for bi-directional voice and data communications including components for transmitting and receiving communications, including memory controller 815, memory cells 820, basic input/output system (BIOS) component 825, processor 830, I/O controller 835, peripheral components 840, second device 855, and system memory controller 860. These components may be in electronic communication via one or more busses (e.g., bus 810).

Memory controller 815 may operate one or more memory cells as described herein. Specifically, memory controller 815 may be configured to support memory with a virtual page size. In some cases, memory controller 815 may include a row decoder, column decoder, or both, as described with reference to FIG. 1.

Memory cells 820 may store information (i.e., in the form of a logical state) as described herein. Memory cells 820 may represent, for example, first set of memory cells 730, second set of memory cells 735, or third set of memory cells 760 with reference to FIG. 7. Additionally, for example, memory cells 820 may be in electronic communication with memory controller 815. Memory cells 820 and memory controller 815 may be located within a second device 855. Second device 855 may, for example, be managed by system memory controller 860.

BIOS component 825 may be a software component that includes BIOS operated as firmware, which may initialize and run various hardware components. BIOS component 825 may also manage data flow between a processor and various other components, e.g., peripheral components, input/output control component, etc. BIOS component 825 may include a program or software stored in read only memory (ROM), flash memory, or any other non-volatile memory.

Processor 830 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 830 may be configured to operate a memory array using a memory controller. In other cases, a memory controller may be integrated into processor 830. Processor 830 may be configured to execute computer-readable instructions stored in a memory to perform various functions (e.g., functions or tasks supporting memory with a virtual page size).

I/O controller 835 may manage input and output signals for device 805. I/O controller 835 may also manage peripherals not integrated into device 805. In some cases, I/O controller 835 may represent a physical connection or port to an external peripheral. In some cases, I/O controller 835 may utilize an operating system such as iOS®, ANDROID®, MS-DOS®, MS-WINDOWS®, OS/2®, UNIX®, LINUX®, or another known operating system. In other cases, I/O controller 835 may represent or interact with a modem, a keyboard, a mouse, a touchscreen, or a similar device. In some cases, I/O controller 835 may be implemented as part of a processor. In some cases, a user may interact with device 805 via I/O controller 835 or via hardware components controlled by I/O controller 835.

Peripheral components 840 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 845 may represent a device or signal external to device 805 that provides input to device 805 or its components. This may include a user interface or an interface with or between other devices. In some cases, input 845 may be managed by I/O controller 835, and may interact with device 805 via a peripheral component 840.

Output 850 may also represent a device or signal external to device 805 configured to receive output from device 805 or any of its components. Examples of output 850 may include a display, audio speakers, a printing device, another processor or printed circuit board, etc. In some cases, output 850 may be a peripheral element that interfaces with device 805 via peripheral component(s) 840. In some cases, output 850 may be managed by I/O controller 835

System memory controller 860 may be host or may be an interface between the host and memory controller 815. A host may be a component or device that controls or directs operations for a device of which memory controller 815 and corresponding memory array are a part. A host may be a component of a computer, mobile device, or the like. Or device 805 may be referred to as a host.

The components of device 805 may include circuitry designed to carry out their functions. This may include various circuit elements, for example, conductive lines, transistors, capacitors, inductors, resistors, amplifiers, or other active or inactive elements, configured to carry out the functions described herein. Device 805 may be a computer, a server, a laptop computer, a notebook computer, a tablet computer, a mobile phone, a wearable electronic device, a personal electronic device, or the like. Or device 805 may be a portion or aspect of such a device.

Figure 9:
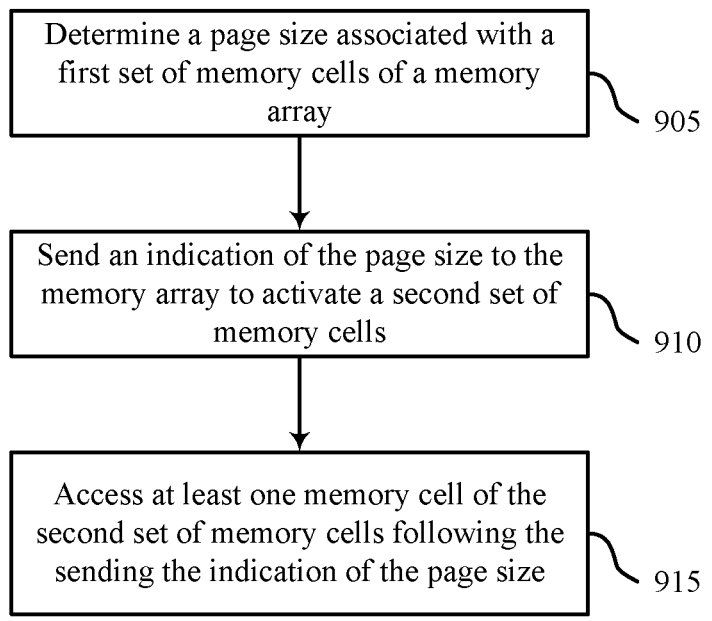
FIG. 9 is a flowchart that illustrates a method or methods for operating a memory device that supports a virtual page size in accordance with examples of the present disclosure.

FIG. 9 shows a flowchart illustrating a method 900 for memory with a virtual page size in accordance with embodiments of the present disclosure. The operations of method 900 may be implemented by a memory controller (e.g., memory controller 615 with reference to FIG. 6) or its components as described herein. For example, the operations of method 900 may be performed by a memory controller as described with reference to FIG. 6 through FIG. 8. In some examples, a memory controller may execute a set of codes to control the functional elements of the device to perform the functions described below. Additionally or alternatively, the memory controller may perform some or all of the functions described below using special-purpose hardware.

At block 905 the memory controller may determine a page size associated with a first set of memory cells of a memory array. The operations of block 905 may be performed according to the methods described with reference to FIG. 1 through FIG. 8. In certain examples, some or all of the operations of block 905 may be performed by a memory controller as described with reference to FIG. 6 through FIG. 8.

At block 910 the memory controller may send an indication of the page size to the memory array to activate a second set of memory cells. The operations of block 910 may be performed according to the methods described with reference to FIG. 1 to FIG. 8. In certain examples, some or all of the operations of block 905 may be performed by a memory controller as described with reference to FIG. 6 through FIG. 8.

At block 915 the memory controller may access at least one memory cell of the second set of memory cells following the sending the indication of the page size. The operations of block 915 may be performed according to the methods described with reference to FIG. 1 to FIG. 8. In certain examples, some or all of the operations of block 905 may be performed by a memory controller as described with reference to FIG. 6 through FIG. 8.

In some cases, the method may also include determining a page size associated with a first set of memory cells of a memory array. Additionally or alternatively, the number of bits for the row address and the number of bits for the column address may each comprise a value that is less than a total number of bits of the memory array. In some cases, the method may also include accessing at least one memory cell of the second set of memory cells following the sending the indication of the page size.

Additionally, for example, the first set of memory cells may be a subset of the second set of memory cells. The method may also include programming the at least one memory cell of the second set of memory cells based at least in part on the page size. In some examples, the method may also include sending an indication of the page size to the memory array to activate a second set of memory cells. Additionally or alternatively, for example, the method may also include receiving the command to use the page size from a host that is coupled with the memory array.

In additional examples, the indication of the page size may comprise a first activation command and a second activation command. The first activation command may comprise a number of bits for a row address that is based at least in part on the determining the page size. Additionally, for example, the second activation command may comprise a number of bits for a column address that is based at least in part on the determining the page size. In further cases, the method may also include receiving a command to use the page size, wherein the page size associated with the first set of memory cells may be determined in response to receiving the command.

Figure 10:
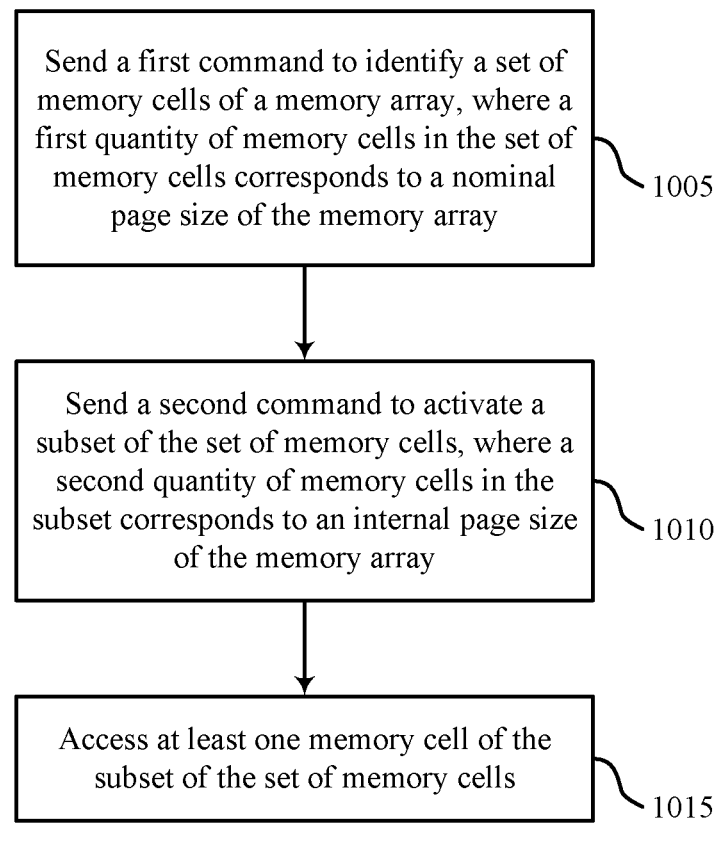
FIG. 10 is a flowchart that illustrates a method or methods for operating a memory device that supports a virtual page size in accordance with examples of the present disclosure.

FIG. 10 shows a flowchart illustrating a method 1000 for memory with a virtual page size in accordance with embodiments of the present disclosure. The operations of method 1000 may be implemented by a memory controller (e.g., memory controller 615 with reference to FIG. 6) or its components as described herein. For example, the operations of method 1000 may be performed by a memory controller as described with reference to FIG. 6 through FIG. 8. In some examples, a memory controller may execute a set of codes to control the functional elements of the device to perform the functions described below. Additionally or alternatively, the memory controller may perform some or all of the functions described below using special-purpose hardware.

At block 1005 the controller may send a first command to identify a set of memory cells of a memory array, wherein a first quantity of memory cells in the set of memory cells may correspond to a nominal page size of the memory array. The operations of block 1005 may be performed according to the methods described with reference to FIG. 1 through FIG. 8. In certain examples, some or all of the operations of block 1005 may be performed by a memory controller as described with reference to FIG. 6 through FIG. 8.

At block 1010 the memory controller may send a second command to activate a subset of the set of memory cells, wherein a second quantity of memory cells in the subset may correspond to an internal page size of the memory array. The operations of block 1010 may be performed according to the methods described with reference to FIG. 1 through FIG. 8. In certain examples, some or all of the operations of block 1005 may be performed by a memory controller as described with reference to FIG. 6 through FIG. 8.

At block 1015 the memory controller may access at least one memory cell of the subset of the set of memory cells. The operations of block 1015 may be performed according to the methods described with reference to FIG. 1 through FIG. 8. In certain examples, some or all of the operations of block 1005 may be performed by a memory controller as described with reference to FIG. 6 through FIG. 8.

In some cases, the method may also include sending a first command to identify a set of memory cells of a memory array, wherein a first quantity of memory cells in the set of memory cells may correspond to a nominal page size of the memory array. Additionally or alternatively, the nominal page size may be a page size for a plurality of banks of memory cells within the memory array. Additionally, for example, the method may also include accessing at least one memory cell of the subset of the set of memory cells. In some cases, the method may also include programming at least one memory cell of the subset based at least in part on the internal page size of the memory array.

Additionally, for example, a greater quantity of memory cells of the subset may be accessed than programmed. In some cases, the method may also include sending a second command to activate a subset of the set of memory cells, wherein a second quantity of memory cells in the subset may correspond to an internal page size of the memory array. In some cases, the second command may comprise a row address and a column address that may each based at least in part on the nominal page size of the memory array. Additionally, for example, the method may also include sending a third command that activates a second subset of the subset of the set of memory cells, wherein the second subset may contain a third quantity of memory cells that is less than the second quantity of memory cells.

In further examples, the method may also include receiving an indication of the nominal page size, wherein the first command may be sent in response to receiving the indication. In some cases, the method may also include receiving a request to access a specific memory cell or the subset, wherein the second command may be sent in response to receiving the request. Further, for example, the internal page size of the memory array may be smaller than the nominal page size of the memory array.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100. The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving a request to access one or more memory cells of a memory array;
   sending, to the memory array, a first command to identify a set of memory cells of the memory array based at least in part on the request, wherein the set of memory cells comprises a first quantity of memory cells corresponding to a nominal page size of the memory array, the first quantity of memory cells comprising one or more subsets of memory cells each comprising a second quantity of memory cells corresponding to an internal page size of the memory array and each associated with one or more access operations, wherein the first quantity of memory cells remain deactivated based at least in part on receiving the first command;
   sending, to the memory array and based at least in part on sending the first command to identify the set of memory cells, one or more second commands to activate a first subset of the set of memory cells and a second subset of the set of memory cells, wherein the first subset and the second subset each comprise the second quantity of memory cells corresponding to the internal page size of the memory array, wherein the nominal page size is an integer multiple of the internal page size, and wherein the internal page size is a variable page size and is based at least in part on receiving the request to access the one or more memory cells of the memory array; and
   accessing at least one memory cell of the first subset and at least one memory cell of the second subset in response to the request.

2. The method of claim 1, further comprising:
   programming at least one memory cell of the first subset, the second subset, or both based at least in part on the internal page size of the memory array.

3. The method of claim 2, wherein a first quantity of the accessed at least one memory cell of the first subset and the accessed at least one memory cell of the second subset is greater than a second quantity of the programmed at least one memory cell of the first subset, the second subset, or both.

4. The method of claim 1, wherein the internal page size of the memory array is smaller than the nominal page size of the memory array.

5. The method of claim 1, wherein a second command of the one or more second commands comprises a row address and a column address that are each based at least in part on the nominal page size of the memory array.

6. The method of claim 1, further comprising:
   sending a third command to activate a third subset of the first subset of the set of memory cells, wherein the third subset comprises a third quantity of memory cells that is less than the second quantity of memory cells.

7. The method of claim 1, further comprising:
   receiving an indication of the nominal page size, wherein the first command is sent in response to receiving the indication.

8. The method of claim 7, wherein the request to access the one or more memory cells comprises a request to access a specific memory cell of the first subset, the second subset, or both, and wherein the one or more second commands are sent in response to receiving the request to access the specific memory cell.

9. An electronic memory apparatus, comprising:
   a memory array that includes a plurality of row access lines that are each coupled with a row of memory cells of the memory array and a plurality of column access lines that are each coupled with a column of memory cells of the memory array; and
   a memory controller coupled with the plurality of row access lines and the plurality of column access lines, wherein the memory controller is operable to:
      receive a request to access one or more memory cells of the memory array;
      send, to the memory array, a first command to identify a set of memory cells of the memory array based at least in part on the request, wherein the set of memory cells comprises a first quantity of memory cells corresponding to a nominal page size of the memory array, the first quantity of memory cells comprising one or more subsets of memory cells each comprising a second quantity of memory cells corresponding to an internal page size of the memory array and each associated with one or more access operations, wherein the first quantity of memory cells remain deactivated based at least in part on receiving the first command;
      send, to the memory array and based at least in part on sending the first command to identify the set of memory cells, one or more second commands to activate a first subset of the set of memory cells and a second subset of the set of memory cells, wherein the first subset and the second subset each comprise the second quantity of memory cells corresponding to the internal page size of the memory array, wherein the nominal page size is an integer multiple of the internal page size, and wherein the internal page size is a variable page size and is based at least in part on receiving the request to access the one or more memory cells of the memory array; and
      access at least one memory cell of the first subset and at least one memory cell of the second subset in response to the request.

10. The electronic memory apparatus of claim 9, wherein the second quantity of memory cells is less than the first quantity of memory cells.

11. The electronic memory apparatus of claim 9, wherein the memory controller is further operable to:
    program at least one memory cell of the first subset, the second subset, or both based at least in part on the internal page size of the memory array.

12. The electronic memory apparatus of claim 11, wherein a first quantity of the accessed at least one memory cell of the first subset and the accessed at least one memory cell of the second subset is greater than a second quantity of the programmed at least one memory cell of the first subset, the second subset, or both.

13. The electronic memory apparatus of claim 9, wherein a second command of the one or more second commands comprises a row address and a column address that are each based at least in part on the nominal page size of the memory array.

14. An apparatus, comprising:
means for receiving a request to access one or more memory cells of a memory array;
means for sending, from a memory controller of the apparatus to a memory array comprising a plurality of row access lines and a plurality of column access lines coupled with memory cells of the memory array and the memory controller, a first command to identify a set of memory cells of the memory array based at least in part on the request, wherein the set of memory cells comprises a first quantity of memory cells corresponding to a nominal page size of the memory array, the first quantity of memory cells comprising one or more subsets of memory cells each comprising a second quantity of memory cells corresponding to an internal page size of the memory array and each associated with one or more access operations, wherein the first quantity of memory cells remain deactivated based at least in part on receiving the first command;
means for sending, to the memory array and based at least in part on sending the first command to identify the set of memory cells, one or more second commands to activate a first subset of the set of memory cells and a second subset of the set of memory cells, wherein the first subset and the second subset each comprise the second quantity of memory cells corresponding to the internal page size of the memory array, wherein the nominal page size is an integer multiple of the internal page size, and wherein the internal page size is a variable page size and is based at least in part on receiving the request to access the one or more memory cells of the memory array; and
means for accessing at least one memory cell of the first subset and at least one memory cell of the second subset in response to the request.

15. The apparatus of claim 14, further comprising:
means for programming at least one memory cell of the first subset, the second subset, or both based at least in part on the internal page size of the memory array.

16. The apparatus of claim 15, wherein a first quantity of the accessed at least one memory cell of the first subset and the accessed at least one memory cell of the second subset is greater than a second quantity of the programmed at least one memory cell of the first subset, the second subset, or both.

17. The apparatus of claim 14, wherein the internal page size of the memory array is smaller than the nominal page size of the memory array.

18. The apparatus of claim 14, wherein a second command of the one or more second commands comprises a row address and a column address that are each based at least in part on the nominal page size of the memory array.

19. The apparatus of claim 14, further comprising:
means for sending a third command to activate a third subset of the first subset of the set of memory cells, wherein the third subset comprises a third quantity of memory cells that is less than the second quantity of memory cells.

20. The apparatus of claim 14, further comprising:
means for receiving an indication of the nominal page size, wherein the first command is sent in response to receiving the indication.

* * * * *